United States Patent [19]
Naura et al.

[11] Patent Number: 5,999,447
[45] Date of Patent: Dec. 7, 1999

[54] NON-VOLATILE ELECTRICALLY ERASABLE AND PROGRAMMABLE MEMORY

[75] Inventors: David Naura; Sebastien Zink, both of Aix en Provence, France

[73] Assignee: STMicroelectronics S.A., Gentilly, France

[21] Appl. No.: 09/199,671

[22] Filed: Nov. 25, 1998

[30] Foreign Application Priority Data

Nov. 28, 1997 [FR] France .................................. 97 14982

[51] Int. Cl.$^6$ .................................................. G11C 16/04
[52] U.S. Cl. .............................. 365/185.04; 365/185.11; 365/185.21
[58] Field of Search .................... 365/185.04, 185.11, 365/185.21

[56] References Cited

U.S. PATENT DOCUMENTS

| | | | |
|---|---|---|---|
| 5,173,876 | 12/1992 | Kawashima et al. | 365/185.04 |
| 5,467,396 | 11/1995 | Schossow et al. | 380/4 |
| 5,732,017 | 3/1998 | Schumann et al. | 365/185.11 |
| 5,818,771 | 10/1998 | Yasu et al. | 365/185.04 |
| 5,862,075 | 1/1999 | Leconte et al. | 365/185.04 |

FOREIGN PATENT DOCUMENTS

| | | |
|---|---|---|
| 0 655 742 | 5/1995 | European Pat. Off. . |
| 0 806 772 | 11/1997 | European Pat. Off. . |
| WO 92/21128 | 11/1992 | WIPO . |

OTHER PUBLICATIONS

Krings, G, "Intelligent Memory Chips for Smart Cards", Siemens Components, 1 janvier 1994, vol. 29, No. 1, pp. 13–17.

*Primary Examiner*—Trong Phan
*Attorney, Agent, or Firm*—Allen, Dyer, Doppelt, Milbrath & Gilchrist

[57] ABSTRACT

A non-volatile electrically erasable and programmable memory provides both a SDP (software data protection) function and an OTP (one-time protection) function. The memory comprises a memory array having a plurality of memory cells each for storing an information bit. The memory further comprises at least one supplementary cell for storing a first state bit pertaining to the write-accessible (or non-write accessible) state of all the memory cells of the memory array, and at least one other supplementary cell for storing a second state bit relating to the blank state (or non-blank state) of a group of memory cells designed to be programmed only once by the user. A common management circuit for the SDP and OTP cells is located outside the memory array.

33 Claims, 4 Drawing Sheets

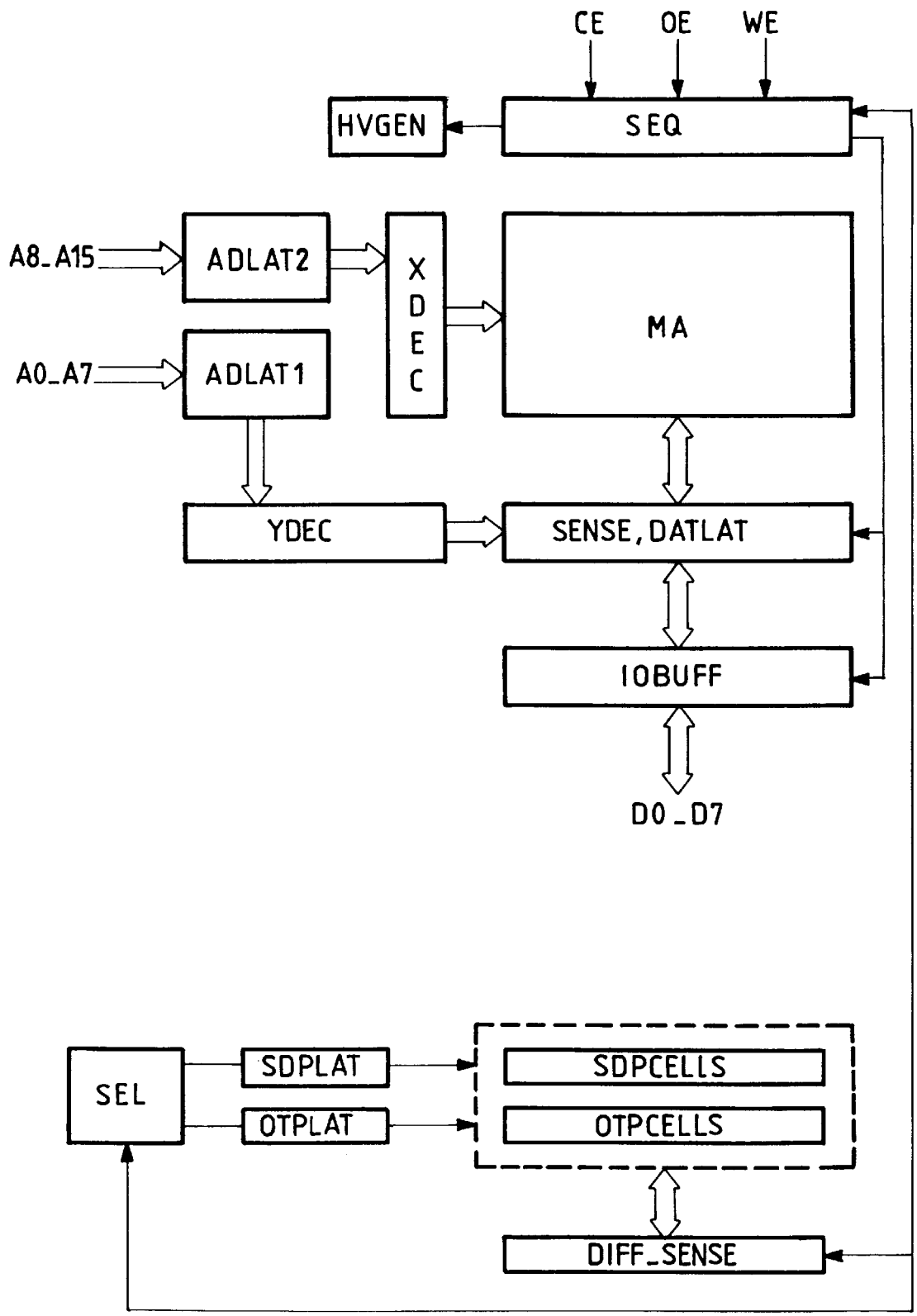
FIG_1

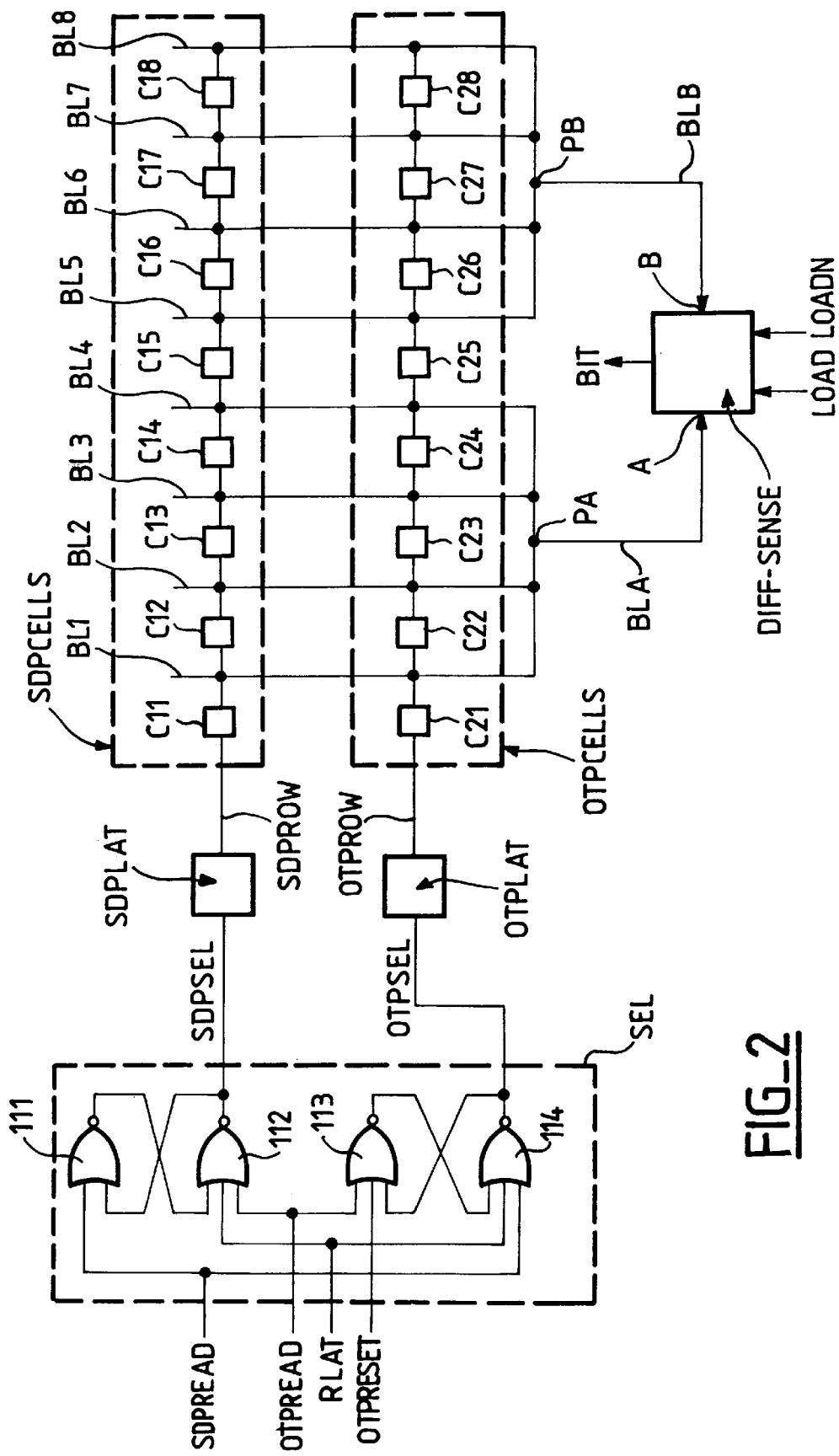
FIG_2

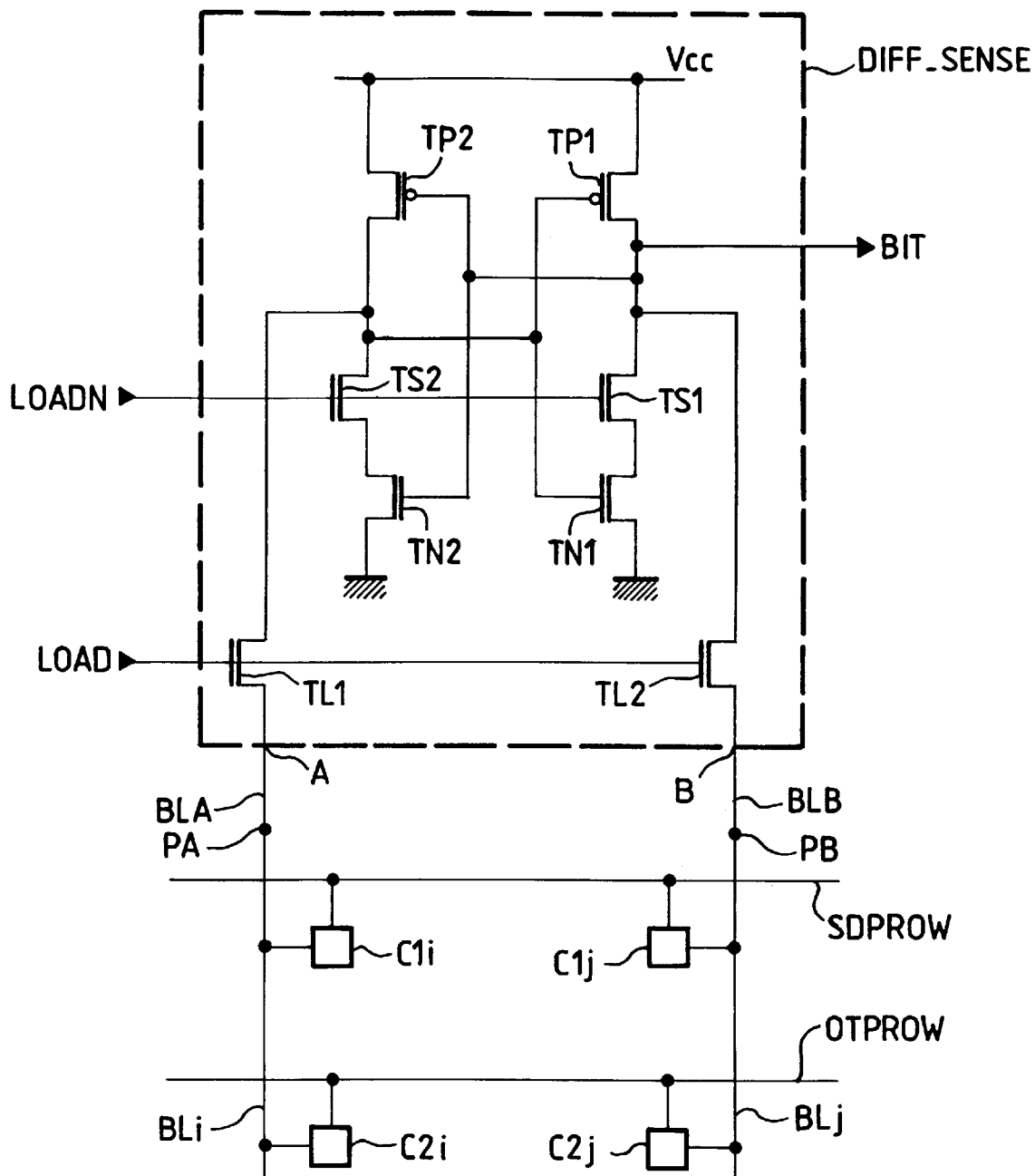
FIG_3
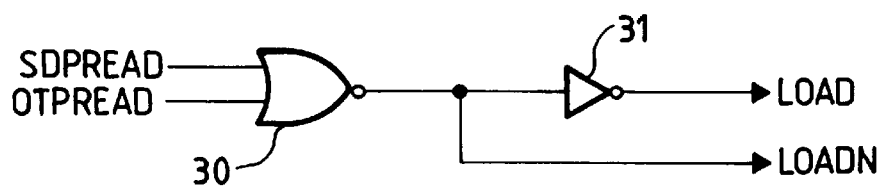
FIG_4

OE 
FIG_5a
CE 
FIG_5b
WE 
FIG_5c
SDPREAD 
FIG_5d
SDPSEL 
FIG_5e
OTPSEL 
FIG_5f
ADDRESS 
FIG_5g
DATA 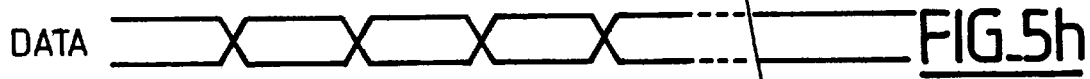
FIG.5h
RLAT 
FIG_5i

NON-VOLATILE ELECTRICALLY ERASABLE AND PROGRAMMABLE MEMORY

FIELD OF THE INVENTION

The present invention relates to integrated circuits, and more particularly, to an electrically erasable and programmable non-volatile memory.

BACKGROUND OF THE INVENTION

Electrically erasable and programmable non-volatile memory devices include serial access memories and parallel access memories. Certain serial access memories have a block of memory cells that are accessible only once in a write mode. These devices are memories that are programmable only once. This block of memory cells generally contains information, such as manufacturing references registered by the manufacturer of an electronic system incorporating the memory so that the component can be traced. These references could be the reference of the system, the manufacturing batch number, the date of manufacture, etc.

This block of memory cells is generally a group of cells of the memory array itself. More particularly, the block of memory cells is a row of cells of the memory array that is organized in a matrix of rows and columns. This row of memory cells is conventionally called an OTP row, or a one-time programmable row. The memory is then said to provide an OTP function. Since the memory cells of the OTP row have the same structure as those of the rest of the memory array, they are also accessible by an appropriate address. A particular bit of the memory, called an OTP bit, contains either a logic 0 value or a logic 1 value when the OTP row is blank. The OTP row is blank if it has not yet been programmed. If the OTP row is programmed, it has the complementary logic value. The OTP bit is generally a special bit of the OTP row itself. The memory has means to permit or not permit writing in the OTP row, depending on the value of this bit. These means naturally include means to read the OTP bit.

However, since the OTP bit is an unspecified bit of the memory array, it is subject to the same risks of deterioration as the other cells of the memory array. This type of deterioration is caused by the application of high voltages needed to program and erase the cells of the memory array. It is important that the OTP bit keep its programmed value once it is programmed to indicate that the OTP row is no longer blank. Failing to do so results in a risk that the OTP row will be erased by another write operation (intentional or unintentional), if the value of the OTP bit has not been accurately read.

The invention seeks to overcome this drawback of the prior art. None of the parallel access memories presently known in the prior art have any OTP function. On the contrary, parallel access memories often have a so-called SDP, or software data protection function, to protect all the memory cells of the memory array against unintentional write operations. Unintentional write operations could cause accidental loss of data.

For parallel access memories, a write operation is possible when a memory chip select input and a read/write input are in a logic 0 state (a third output enable input is in a logic 1 state). The write operation is prompted by the trailing edge of the last of these two inputs, both of which go to a logic 0 state. The logic values present at the data input are then recorded in the memory cell identified by the address corresponding to the logic values present at the address input of the memory chip. These conditions could all occur without being intentionally set up. Such a condition is when there is noise on the electrical lines connected between the above-mentioned inputs of the memory chip. The SDP function makes it possible to avoid this drawback by ensuring that a series of steps prior to a write command are performed at the inputs of the memory chip so that the write operation is possible. For example, the memory has means to prevent any write operation in the memory cells within the memory array. These means are made inadequate by the performance of the above-mentioned series of steps.

For this purpose, the memory comprises a particular bit called an SDP bit. The bit is a logic 0 value if the memory array is write protected and the bit is a complementary logic value if the memory array is not write protected. The value of this bit is read routinely as soon as a write operation is activated in the memory. The time taken to read this bit must be smaller than a certain period of time after which a memory write cycle is activated to perform a write operation. If the value of the SDP bit indicates that the memory is write protected, then means must be provided to prevent this write cycle from being carried out. Means of this kind generally act to inhibit the operation of a voltage booster circuit delivering the high voltages needed for writing in the memory cell.

For an increased reading speed, the SDP bit is generally a supplementary bit of the memory, i.e., it does not form part of the memory array. The SDP bit is write-accessible by a special procedure whose complexity is sufficient to prevent any unintentional programming or erasure of this bit. The SDP function does not have the same value for the serial access memories, where an unintentional write operation is practically impossible. This is due to the fact that for any operation in the memory, the serial input of the memory must be provided with a sequence of signals according to a specific protocol.

SUMMARY OF THE INVENTION

An object of the invention is to provide a non-volatile electrically erasable and programmable memory that provides both a SDP (software data protection) function and an OTP (one-time protection) function. The invention proposes to make profitable use of the known method and means of management of the SDP function with regards to the parallel access memory by also providing an OTP function. The invention can be applied advantageously to a parallel access memory, which can thus have the OTP function as well as the SDP function. However, the invention can also be applied to serial access memories.

The memory comprises a memory array having a plurality of memory cells each for storing an information bit, and comprises at least one supplementary cell for storing a first state bit pertaining to the write-accessible (or non-write-accessible) state of all the memory cells of the memory array. The memory array also comprise at least one other supplementary cell for storing a second state bit relating to the blank (or non-blank) state of a group of memory cells designed to be programmed only once by the user. The memory furthermore comprises management means common for the memory cells storing the first and second state bits. The term supplementary cell designates a cell that is not part of the memory array and is accessible by means that are different from those used to access the different memory cells of the memory array.

Thus, the OTP bit is the second state bit and is outside the memory array. This has the effect of protecting the memory array from possible deterioration that the cells of the memory array are subjected to through repeated write and erase cycles. Furthermore, according to the invention, the silicon surface area taken up by means of the management for the SDP bit and the OTP bit is not double the surface area as compared to the surface area required by means for accessing only one of these bits, such as the SDP bit of the prior art parallel memories. Rather, the silicon surface area is smaller. Finally, the patterns of the masks used for the physical making the invention do not require any new major investment since masks that have already been used will advantageously serve to obtain the known SDP function.

BRIEF DESCRIPTION OF THE DRAWINGS

Other features and advantages of the invention shall appear from the following description. This description is given purely by way of an illustration with reference to the appended drawings, of which:

FIG. 1 is a schematic view of a parallel-access memory, according to the present invention;

FIG. 2 shows a detail of an embodiment of a portion of the memory illustrated in FIG. 1;

FIG. 3 is a drawing of an embodiment of a differential read circuit, according to the present invention;

FIG. 4 is a drawing of a circuit generating control signals for a differential read circuit, according to the present invention; and FIGS. 5a to 5i show timing diagrams of signals that are active during a write operation in the memory, according to the present invention.

DETAILED DESCRIPTION OF THE PREFERRED EMBODIMENTS

In the figures, the same elements bear the same references. By convention, unless stated otherwise, the logic signals presented hereinafter are active at a logic 1 value, and inactive at a logic 0 value.

FIG. 1 shows a memory array MA with a matrix of memory cells arranged in rows and columns. These memory cells can be accessed through an address, for example, an address encoded on 16 bits. This address is provided to access pins A0 to A15 of the memory chip. Each memory chip stores an information bit. In one example, the memory array MA has 256 rows and 256 columns. At the intersection of each row and each column, there is a memory cell.

The eight least significant bits of a memory address that arrive at the access pins A0–A7 are provided to the input of a first address latch ADLAT1. The eight most significant bits of this address arriving at access pins A8–A15 are provided to the input of a second address latch ADLAT2. The function of these address latches ADLAT1 and ADLAT2 is to hold the addresses of the applicable memory cells throughout an operation to access the memory array MA. This operation could be a write operation or a read operation, depending on the logic state of the signals at the control pins CE, OE and WE of the memory chip. These control signals are transmitted to the input of a circuit or sequencer SEQ. The sequencer SEQ controls all the internal elements of the memory during a memory write or memory read operation. In particular, the sequencer SEQ controls operation of a voltage booster circuit HVGEN generating the high voltages needed to erase and program the memory cells.

Furthermore, the sequencer SEQ controls the address latches ADLAT1 and ADLAT2. Once the address is loaded into these latches, the two groups of addresses A0–A7 and A8–A15 are transmitted to respective inputs of a column decoder YDEC and a row decoder XDEC. These decoders have the function of selecting a memory cell, or a group of memory cells, of the memory array MA that will be effected by the write operation, or read operation as the case may be.

Well known to one skilled in the art, the column decoder YDEC is closely linked to a read circuit SENSE whose role is to read the current flowing in the bit lines of the memory to which the memory cells effected by the read operation in progress are connected. To this end, the memory comprises a data latch DATLAT, for example, to hold the data read after a read operation, or the data to be written before a write operation. The data latches are connected to buffer gates contained in an input/output circuit IOBUFF. For a read operation, this input/output circuit IOBUFF delivers the data elements on eight bits to the data access pins D0–D7 of the memory chip. For a write operation, this input/output circuit IOBUFF receives the data elements on eight bits using the data access pins D0–D7 of the memory chip.

Operation of the read/write circuit SENSE and the input/output circuit IOBUFF is also controlled by the sequencer SEQ. This sequencer SEQ is controlled from outside the memory through the control pins for the inputs CE, OE and WE. The signals arriving at these three inputs are active in a logic 0 state. The input CE (chip enable input) is the chip select input. It must be active for any read or write operation in the memory chip. The input OE (output enable) and the input WE (write enable) are used to control a read operation or a write operation in the memory. A read operation is activated when the input OE is active and the input WE is inactive. The input CE is of course itself active. A write operation is activated when the input OE is inactive (kept at a logic 1 value) and the input WE becomes active. The input CE of course being itself active. The elements of the parallel access memory presented above are conventional and known to one skilled in the art. They combine the memory array MA and means to manage the memory cells that this memory array contains.

The memory of the invention furthermore comprises at least one supplementary cell storing a first state bit relating to the write-accessible or non-write-accessible character of all the cells of the memory array MA. This first state bit is the SDP bit. The function of the SDP bit is to indicate whether the cells of the memory array MA are write-accessible or not. To do so, it has a specified logic value (e.g., a logic 1 value) when the cells of the memory array MA are not write-accessible. The SDP bit has a complementary logic value (e.g., a logic 0 value) when they are write-accessible.

Preferably, the memory has a group of several supplementary cells SDPCELLS for redundantly storing the SDP bit. Having a plurality of cells to store the same bit redundantly, i.e., the value of the SDP bit, minimizes the consequences of a defective cell or cells, or of damage to one or more of these cells. The SDP bit is a particular bit whose value must be saved with a degree of security against malfunctioning. This degree of security must be greater than the degree of security permissible for the storage memory cells of the memory array MA. Furthermore, since they are read at each memory write operation, the memory cells that store this SDP bit are liable to be damaged more quickly.

Preferably, the group SDPCELLS has an even number of cells, namely 2n cells (2 times n), with n being an integer other than zero. Among these cells, a first sub-group of n cells, known as primary cells, are in a specified state. These cells are either erased or programmed, i.e., they store a logic value 0 or 1 respectively (hereinafter it will be said that they are at a logic 0 or logic 1 value), while a second sub-group formed by the n other cells of the group SDPCELLS have the complementary logic value. This characteristic of the invention enables the use of a read circuit for the cells of the group SDPCELLS that is a differential type circuit.

An exemplary embodiment of a read circuit of this kind shall be described and its advantages shall be given below with reference to FIG. 3. The memory cells of the group SDPCELLS are said to be supplementary. This is because they are advantageously distinct from the memory cells of the memory array since they have been made in a region of the silicon surface taken up by the memory other than the region on which these memory cells are made. In addition, they have specific management means that shall be described below. Thus, these cells are not effected by the high programming or erasure voltages applied to the cells of the memory array MA during the lifetime of the memory.

According to the invention, the memory furthermore comprises at least one other supplementary cell storing a second state bit, called an OTP bit. This bit relates to the blank or non-blank state of a group of memory cells designed-to be programmed only once by the user. The user is defined as a designer of an electronic system comprising the memory. This group of memory cells is preferably included in the memory array. For instance, this group of memory cells is a row of cells in the memory array MA, called the OTP row. This feature provides an advantage for addressing these cells and for the design of the masks used to make the memory on silicon.

Furthermore, the information elements stored in the OTP row do not warrant a degree of security against malfunctioning that is different from the security applied for the other information elements stored in the memory. Only the OTP bit, pertaining to the blank state or non-blank state of the OTP row, warrants the use of special precautions. While the OTP bit is not designed to be read at each read operation in the memory, as is the case with the SDP bit, its value must also be stored to obtain a very high degree of security against possible malfunctioning. Otherwise, there will be a risk that the information recorded by the user in the OTP row will be wiped out by a new write operation during the lifetime of the electronic system that incorporates it. This is also why the memory preferably has a group of memory cells OTPCELLS that store the OTP bit redundantly. Preferably, the group of memory cells OPTCELLS comprises an even number 2p (2 times p, where p is an integer other than zero) of supplementary memory cells of this kind. The advantages of these characteristics have already been referred to above with respect to the SDP bit.

According to the invention, the memory furthermore comprises means to manage both the supplementary cell or cells storing the SDP bit and the supplementary cell or cells storing the OTP bit. These common management means have the function of enabling read and write access to the supplementary memory cells storing the SDP bit and the OTP bit. These means include a first circuit and a second circuit forming a latch for the addressing of these cells, SDPLAT and OTPLAT respectively. The first and second circuits respectively enable the selection of the groups of memory cells SDPCELLS and OTPCELLS. More specifically, the addressing latches SDPLAT, OTPLAT are activated by a selection circuit cell so that, as the case may be, only one of the two groups of supplementary cells SDPCELLS or OTPCELLS is selected. In other words, at each point in time, either no group of supplementary cells is selected for a read or write operation or only one of the groups of SDP or OTP cells is selected, but never both groups at the same time.

The working of the means for the management of the groups of supplementary memory cells SDPCELLS and OTPCELLS is controlled by the sequencer SEQ of the memory. In fact, everything happens as if the groups of supplementary memory cells SDPCELLS and OTPCELLS form a small memory array distinct from the memory array MA. This small memory array is managed by specific management means comprising the addressing latches SDPLAT and OTDPLAT, the selection circuit SEL, and the differential read circuit DIFF-SENSE. These management means are operated by the sequencer SEQ, which also operates the means for the management of the memory array MA.

FIG. 2 shows in detail an embodiment of a portion of the elements of the memory illustrated in FIG. 1. The group of supplementary memory cells SDPCELLS comprises, in one example, eight memory cells C11–C18. They are positioned at the intersection of a word line SDPROW with respective bit lines BL1–BL8. Similarly, the group of supplementary memory cells OTPCELLS advantageously comprises eight cells C21–C28. These cells are positioned at the intersection of a word line OTPROW with respective bit lines BL1–BL8. The supplementary memory cells C11–C18 and C21–C28 form a small specific memory array with two rows and eight columns. These memory columns have, for example, the standard structure of EEPROM memory cells and comprise a floating-gate transistor series-connected with a selection transistor.

Among the 2n cells of the group SDPCELLS, the n cells are called primary cells. Among the 2p cells of the OTPCELLS, the p cells are called secondary cells. The primary cells are connected to n bit lines and respective p bit lines which are connected to the same line BLA. The other n cells (and respectively the other p cells) called secondary cells are connected to bit lines joined together in the same line BLB. Thus, in the example of FIG. 2, the primary cells C11–C14 of the group SPDCELLS and C21 to C24 of the group OTPCELLS are joined to the bit lines BL1–BL4 which are joined, at the node PA, to the same line BLA. The secondary cells C15–C18 of the group SDPCELLS and C25–C28 of the group OTPCELLS are combined, at the node PB, in the same line BLB. The lines BLA and BLB are connected respectively to a first differential input A and to a second differential input B of the differential read circuit DIFF-SENSE.

With this configuration, the input A is simultaneously loaded with the contents of the primary memory cells of each group, i.e., the current entering A by the line BLA is the sum of the currents flowing in the primary memory cells C11–C14 or, if necessary, C21–C24. As previously stated and as shall be further specified below, only one group of cells SDPCELLS or OTPCELLS is selected at a time so that the current entering the input A is either zero or equal to the sum of the currents flowing in the primary cells C11–C14 (selected group SDPCELLS), or equal to the current flowing in the primary cells C21–C24 (selected group OTPCELLS). In the two cases, the current may also be zero depending on whether the state of the cell is programmed or erased. In the same way, the input B is simultaneously charged by the contents of the secondary memory cells of each group SPDCELLS or OTPCELLS, i.e., the current entering the input.B through the line BLB is either zero or equal to the sum of the currents flowing in the secondary memory cells C15–C18 of the group SDPCELLS, or equal to the sum of the currents flowing in the secondary memory cells C25–C28 of the group OTPCELLS.

The primary cells of each group will be programmed or erased simultaneously so that they theoretically have the same logic 1 or logic 0 value. An exception is made in the event of the deterioration of at least one of the cells. The same arrangement is planned for the secondary cells of each group. Furthermore, if the primary memory cells of an unspecified group is at the logic 0 value, the secondary memory cells of the group will be at the logic 1 value and vice versa. This necessarily results in a difference between the currents entering input A and input B of the differential read circuit DIFF-SENSE. The sign of this difference determines the logic value of the signal BIT delivered at the output of the circuit DIFF-SENSE. This value is the value of the SDP bit if the group of memory cells SDPCELLS is selected, or the value of the OTP bit if the group of memory cells OTPCELLS is selected. The circuit DIFF-SENSE receives at output a control signal LOAD, and a control signal LOADN which is complementary to the signal LOAD. The mode of generating these control signals shall be explained below with reference to FIG. 4.

FIG. 3 shows an embodiment of the differential read circuit DIFF-SENSE according to the invention. The figure shows only one primary supplementary memory cell C1i (with i ranging from 1 to 4) and one secondary supplementary memory cell C1j (with j ranging between 5 and 8) of the group SDPCELLS. Also shown is a primary supplementary memory cell C2i and a secondary supplementary memory cell C2j of the group OTPCELLS. Consequently, the figure shows only one bit line BLi connected to the node PA and only one bit line BLj connected to the node PB. The structure of the differential read circuit DIFF-SENSE is similar to an RS flip-flop circuit using CMOS technology.

The differential read circuit has a first CMOS type inverter comprising a P-type MOS transistor TP1 series-connected with an N-type MOS transistor TN1 between a positive supply pin delivering a positive direct voltage Vcc and ground. A second CMOS type inverter comprising a P-type MOS transistor TP2 and an N-type MOS transistor TN2 are connected the same way. The output of one of the inverters is connected to the input of the other, and vice versa. The input of each inverter is taken at the common gates of the two transistors, and the output at their common drains. This structure is complemented by two N-type MOS transistors TS1 and TS2 connected between respective drains of the transistors TP1 and TN1 and between the drains of the transistors TP2 and TN2. At their control gate, these two transistors TS1 and TS2 simultaneously receive the control signal LOADN. The circuit DIFF-SENSE also has two N-type MOS transistors TL1 and TL2. TL1 is connected between input A of the circuit and the input of the first inverter TP1-TN1. TL2 is connected between input B of the circuit and the input of the second inverter TP2-TN2.

At their control gates, these two transistors TL1, TL2 simultaneously receive the control signal LOAD. The output signal BIT of the circuit DIFF-SENSE is applied to the drain of the transistor TP1. The advantage of a differential read circuit of this kind lies in the speed of reading. The output BIT can go from one logic value to another at the end of a relatively short period of time, e.g., about 10 ns as to 30 ns for standard read circuits.

Hereinafter, it shall be assumed that when a supplementary memory cell is in the programmed state, it is crossed by a conduction current as soon as it is selected, i.e., as soon as the word line to which it is connected is taken to a positive voltage of a specified value. This specificed value is known as a read voltage. Conversely, when it is in an erased state, it is not crossed by any current.

Preferably, should the OTP bit and/or the SDP bit be stored redundantly by a group of eight cells (four primary cells and four secondary cells), it is preferable that the impedance of the transistors TP1 and TP2 of the circuit DIFF-SENSE be such that the maximum current which can go through them is greater than 1 multiplied by the conduction current of a supplementary memory cell in the programmed state, and less than three times this current. This choice of the impedance of the inputs A and B of the circuit DIFF-SENSE enables an accurate reading of the state of the OTP bit (or SDP bit as the case may be), even if one of the four primary cells and/or one of the four secondary cells is defective.

The circuit DIFF-SENSE works as described in the following paragraphs. A first case is when the signal LOAD is active (i.e., a logic 1 value) and the transistors TL1 and TL2 are conductive. Since the signal LOADN is not active, the transistors TS1 and TS2 operate like open circuits. The voltage at the drains of the transistors TP1 and TP2 is determined by the current flowing from the pin Vcc to the inputs A and B. In other words, the current flows through respective primary cells and secondary cells. The voltage at the drain of the transistor TP1 or of the transistor TP2 rises depending on whether the respective primary cells or secondary cells of the group of selected cells are in the programmed state. Conversely, the voltage at the drain of the other transistors TP2 or TP1 falls. The output signal BIT then delivers a logic 1 or logic 0 value respectively.

A second case is when the signal LOAD is not active (i.e., a logic 0 value) and the inputs A and B are disconnected. The transistors TL1 and TL2 operate like open circuits since the signal LOADN is then active. The transistors TS1 and TS2 are conductive and the drain voltage of the transistors TP1 and TP2 are held at their logic value. The first case above corresponds to an operation for reading supplementary memory cells. With the above characteristics pertaining to the size of the memories, even if at least one of the primary memory cells and/or at least one of the secondary memory cells is defective, and therefore have the reverse logic value to the one that it should normally have, the logic value delivered at the output BIT of the differential read circuit DIFF-SENSE is the correct value of the SDP bit.

Referring to FIG. 2 again, the word lines SDPROW are connected to the group of memory cells SDPCELLS and may be provided with the read voltage by the addressing latches SDPLAT, to whose output they are connected. The word lines OTPROW are connected to the group of memory cells OTPCELLS and are provided with the read voltage by the addressing latches OTPLAT respectively, to whose output they are connected. These latches are sensitive to the level of the voltage present at their inputs. The selection circuit SEL delivers two selection signals SDPSEL and OTPSEL to activate the addressing latches to select, as the case may be, only one of the two groups of supplementary cells SDPCELLS or OTPCELLS at a time. In other words, the selection circuit SEL works in such a way that these selection signals SDPSEL and OTPSEL are not active simultaneously.

The circuit SEL comprises a first RS type flip-flop circuit formed by two NOR gates 111 and 112. The output of each of these gates is connected to a first input of the other gate. The circuit SEL further comprises a second RS type flip-flop circuit formed by two NOR gates 113 and 114 which are connected in the same way. The output of the first RS type flip-flop circuit is connected to the input of the latch SDPLAT to deliver the signal SDPCELLS. The output of the second RS type flip-flop circuit is connected to the input of the latch OTPLAT to deliver the selection signal OTPSEL. A control signal SDPREAD is simultaneously transmitted to a second input of the gate 111 and to a second input of the gate 114. Another control signal OTPREAD is simultaneously transmitted to a second input of the gate 112 and to a second input of the gate 113. A zero-setting signal RLAT is simultaneously transmitted to a third input of the gate 112 and a third input of the gate 114. Finally, a signal to reset the OTP bit is transmitted on the third input bit of the gate 113.

To understand the rest of the explanation, the following observations are made as described below. The logic value of the selection signal SDPSEL or of the selection signal OTPSEL is set at 1 when at least one of the signals sent to the respective inputs of the gate 111 or 113 is active (at the logic value 1). Similarly, the logic value of the signals SDPSEL and OTPSEL is set at 0 when at least one of the signals sent to the respective inputs of the gate 112 or 114 respectively is active (at the logic value 1).

FIG. 4 shows a possible approach to the generation of the control signals LOAD and LOADN from the signals SDPREAD and OTPREAD. These signals are transmitted to the two inputs of a NOR gate 30, whose output is applied to the input of an inverter 31. The output of the inverter 31 delivers the signal LOAD while the output of the gate 30 delivers the complementary signal LOADN. The signal LOAD is active (at a logic 1 level) as soon as one of the control signals SDPREAD or OTPREAD is active.

The working of the means for the management of the supplementary memory cells during a write operation in the memory shall now be described with reference to the timing diagrams of FIGS. 5a–5i. FIGS. 5a–5c respectively show the memory control signals OE, CE and WE. These signals are transmitted from the exterior on access pins or inputs of the memory chip to control their operation, and they are active at a logic 0 value.

For a write operation in the memory, the signal CE must be active and the signal OE must be inactive. The write instructions are then activated by the trailing edges of the signal WE. The address information available at the address inputs A0–A15 of the memory chip are loaded into the latches ADLAT1 and ADLAT2 at the trailing edges of the signal WE. The pieces of information pertaining to data that are properly present at the data inputs D0–D7 of the memory chip are loaded into the latch DATLAT on the rising edges of the signal WE. With a view to providing a complete description, it may be observed that, especially in read operations, the role of the signals CE and WE are actually symmetrical.

The control signals SDPREAD and OTPREAD are initially at the logic 0 value. The first trailing edge of the signal WE activates the transmission of a read pulse on the signal SDPREAD (FIG. 5d). The signal SDPREAD then goes to a logic 1 value. The selection circuit SEL then causes the selection signal SDPCELL pass to the logic 1 value (FIG. 5e) while the selection signal OTPSEL is kept at the logic 0 value (FIG. 5f). The bit line SDPROW is then taken to the read voltage by the addressing latch SDPLAT so that the group of supplementary memory cells SDPCELLS is selected.

Furthermore, the control signals LOAD and LOADN respectively become active and inactive (FIG. 4) so that the differential read circuit DIFF-SENSE delivers the value of the SDP bit at its output BIT. This value is transmitted to the sequencer circuit SEQ of the memory. If the SDP bit is at the logic 1 value, the memory is write-protected and the sequencer SEQ prevents the write operation in the memory array MA. It does so, for example, by inhibiting the operation of the circuit HVGEN for the generation of the high voltages needed to erase and reprogram the concerned cells of the memory array. Since the write instruction is sequenced by the circuit SEQ, starting from the appearance of the first trailing edge on the signal WE, it will be understood that the SDP bit must be read as quickly as possible, and at the latest before the instant planned for the activation of the write cycle in the memory array. This is proper with application of high voltages of erasure and programming to the concerned cells of the memory array. It will be noted that the return of the bit SDPREAD to the logic 0 value at the end of the read pulse of the bit SPD has no consequences for the selection of the supplementary memory cells. The state of the output of the RS flip-flop circuit formed by the gates 111 and 112 and, therefore, the state of the latch SDPLAT are then held. The differential read circuit DIFF-SENSE proposed according to the invention then enables a read operation that is sufficiently quick for this purpose.

FIGS. 5a–5i show a sequence comprising a plurality of successive write instructions in page mode. It is known that in this way a mode of writing in the memory is designated. According to this write mode, several write instructions are successively activated by the trailing edges of a series of negative pulses of the signal WE. The time interval between two such successive pulses are smaller than a specified threshold value, for example 120 µs. If the addresses of the memory cells concerned by these write instructions correspond to one and the same row of the memory array MA (also called a physical page), a write mode enables all the cells identified by these addresses to be programmed simultaneously during a single write cycle. The page mode enables a faster programming of the memory. When the memory write instructions are received in page mode, as is the case in FIGS. 5a–5i, the sequencer SEQ generates the pulse on the signal SDPREAD only upon reception of the first instruction of the series.

According to the invention, at the end of a specified period of time, after a leading edge of the signal WE that is greater than the specified threshold value, the sequencer circuit SEQ of the memory generates a positive pulse at the zero-setting signal RLAT. The passage to the logic 1 value of the signal RLAT (which is transmitted to the input of the gates 112 and 114 of the circuit SEL), prompts the passage of the signal SDPSEL to the logic 0 value. This resets the latch SDPLAT and therefore deselects the cell of the group SDPCELLS. Thus, the SDP bit is read at each read instruction in normal mode or at each series of read instructions in page mode to permit or not permit the activation of the write cycle in the memory array MA.

What remains to be presented is the mode of writing the SDP bit, which makes it possible to modify its value if necessary. It will be noted that the memory naturally comprises means to dictate the high voltages of erasure and programming on the supplementary memory cells of the groups SDPCELLS and OTPCELLS. These are standard means and therefore are not described herein. These means are operated also by the sequencer SEQ. To write in the cells of the group SDPCELLS, it is necessary, in page mode, to generate a sequence of several consecutive write instructions tending to write bytes of specified values at specified addresses of the memory array MA that are in distinct physical pages. This complex procedure seeks to prevent the value of the SDP bit from being accidentally modified.

The procedure for reading the OTP bit is identical to that of the SDP bit described above, and may be determined from the signals of FIGS. 5a–5i and from the drawing of FIG. 2. The only difference is that the read pulse OTPREAD is generated after reception of a sequence of page mode write instructions designed for writing in the row OTP. The read pulse OTPREAD is not generated when a trailing edge is detected on the access pin WE. As will have been understood, the read pulse SDPREAD and the read pulse OTPREAD therefore cannot overlap each other. As a result, there can be no conflict at the selection circuit SEL.

The procedure of read access to the OTP bit is special. First, the value 1 is routinely written in the OTP bit after a page mode write sequence for writing in the OTP row has been received. This is done whether this sequence has been actually followed by a write cycle (the OTP row being at a value 0) or not (the OTP row being at a logic 1 value). The sequencer then generates a write pulse on the signal OTPREAD to enable the selection of the supplementary memory cells of the group OTPCELLS.

Furthermore, the logic 0 value is written in the OTP bit if a high voltage, e.g., about 12 volts, is present on at least one access pin of the memory chip. This is possible in combination with a particular configuration of logic values on certain other access pins of the memory chip. It may be foreseen, for example, that it will be necessary to apply this very high voltage to certain address access pins among the pins A0–A15 while the control pins CE and WE are at the logic 0 value, and the control pin OE at the logic 1 value. When these conditions are fulfilled, the sequencer generates a pulse on the signal OTPRESET for resetting the OTP bit placing it in the logic 1 state to activate the addressing latch OTPLAT. This has the consequence of selecting the supplementary memory cells of the group OTPCELLS (FIG. 2). The term high voltage designates a voltage greater than the value of the supply voltage of the memory chip, which is about 5 volts.

It will be noted in conclusion that the control signals CE, OE and WE, as well as the address signals A0–A15, and the data signals D0–D7 are exchanged between the memory and its external environment by access pins of the chip containing the memory. This mode of exchange of signals between the memory and its environment described above is proper for parallel access memories. However, the invention is not limited to memories of this type and may equally well be applied to serial access memories. In this case, the serial access memory exchanges control, address and data signals with its external environment by means of one and the same access pin of the memory chip, according to a specific series communications protocol. For example, we might cite serial access memories working according to the I2C protocol, which is particularly widespread in electronics systems for television and video.

That which is claimed is:

1. A non-volatile electrically erasable and programmable memory comprising:
    a memory array comprising a plurality of memory cells each for storing an information bit;
    at least one first supplementary cell for storing a first state bit corresponding to a write accessible or non-write accessible state of the plurality of memory cells in said memory array;
    at least one second supplementary cell for storing a second state bit corresponding to a blank or non-blank state of a plurality of memory cells to be programmed only once in said memory array; and
    common management means for said at least one first and at least one second supplementary cells for respectively storing the first and second state bits.

2. A memory according to claim 1, wherein the plurality of memory cells to be programmed only once is included within said memory array.

3. A memory according to claim 1, wherein said at least one first supplementary cell comprises a plurality of 2n supplementary cells for redundantly storing the first state bit, where n is a non-zero integer; and wherein the plurality of 2n supplementary cells comprise n primary memory cells at a first logic value and n secondary memory cells at a complementary logic value.

4. A memory according to claim 1, wherein said at least one second supplementary cell comprises a plurality of 2p supplementary cells for redundantly storing the second state bit, where p is a non-zero integer; and wherein the plurality of 2p supplementary cells comprise p primary memory cells at a first logic value and p secondary memory cells at a complementary logic value.

5. A memory according to claim 3, wherein said common management means comprises a differential read circuit having a first differential input for simultaneously loading a value of the n primary memory cells, and a second differential input for simultaneously loading a value of the n secondary memory cells.

6. A memory according to claim 4, wherein said common management means comprises a differential read circuit having a first differential input for simultaneously loading a value of the p primary memory cells, and a second differential input for simultaneously loading a value of the p secondary memory cells.

7. A memory according to claim 5, wherein an impedance of the first and second differential inputs of said differential read circuit allows a maximum current that can flow through respective first and second inputs to be greater than about 1 multiplied by a conduction current of said at least one first supplementary cell in a programmed state and less than about n−1 times the same conduction current.

8. A memory according to claim 6, wherein an impedance of the first and second differential inputs of said differential read circuit allows a maximum current that can flow through a respective first and second input to be greater than about 1 multiplied by a conduction current of said at least one second supplementary memory cell in a programmed state and less than about n−1 times the same conduction current.

9. A memory according to claim 1, wherein said common management means comprises a first addressing latch; and a second addressing latch for selecting said at least one first and at least one second supplementary cells respectively storing the first and second state bits.

10. A memory according to claim 9, further comprising a selection circuit; and wherein said first and second addressing latches are activated by said selection circuit so that only one of said at least one first and at least one second supplementary cells is selected at a time.

11. A memory according to claim 10, wherein said selection circuit comprises a first RS type flip-flop circuit; and a second RS type flip-flop circuit having outputs respectively connected to an input of said first addressing latch and said second addressing latch; and wherein said first and second RS flip-flop circuits are controlled so that only one of said at least one first and at least one second supplementary cells is selected at a time.

12. A memory according to claim 10, further comprising at least one access pin; and wherein said selection circuit comprises means to activate said second addressing latch when a high voltage is present on said at least one access pin for enabling resetting of the second state bit.

13. A non-volatile electrically erasable and programmable memory comprising:

a memory array comprising a plurality of memory cells each for storing an information bit;

at least one first supplementary cell for storing a first state bit corresponding to a write accessible or non-write accessible state of the plurality of memory cells in said memory array;

at least one second supplementary cell for storing a second state bit corresponding to a blank or non-blank state of a plurality of memory cells to be programmed only once in said memory array; and a selection circuit comprising a first addressing latch activated by said selection circuit for selecting said at least one first supplementary cells, and a second addressing latch activated by said selection circuit for selecting said at least one second supplementary cells, and one of said at least one first and at least one second supplementary cells being selected at a time.

14. A memory according to claim 13, wherein the plurality of memory cells to be programmed only once is included within said memory array.

15. A memory according to claim 13, wherein said at least one first supplementary cell comprises a plurality of 2n supplementary cells for redundantly storing the first state bit, where n is a non-zero integer; and wherein the plurality of 2n supplementary cells comprise n primary memory cells at a first logic value and n secondary memory cells at a complementary logic value.

16. A memory according to claim 13, wherein said at least one second supplementary cell comprises a plurality of 2p supplementary cells for redundantly storing the second state bit, where p is a non-zero integer; and wherein the plurality of 2p supplementary cells comprise p primary memory cells at a first logic value and p secondary memory cells at a complementary logic value.

17. A memory according to claim 15, wherein said selection circuit comprises a differential read circuit having a first differential input for simultaneously loading a value of the n primary memory cells, and a second differential input for simultaneously loading a value of the n secondary memory cells.

18. A memory according to claim 16, wherein said selection circuit comprises a differential read circuit having a first differential input for simultaneously loading a value of the p primary memory cells, and a second differential input for simultaneously loading a value of the p secondary memory cells.

19. A memory according to claim 17, wherein an impedance of the first and second differential inputs of said differential read circuit allows a maximum current that can flow through respective first and second inputs to be greater than about 1 multiplied by a conduction current of said at least one first supplementary cell in a programmed state and less than about n−1 times the same conduction current.

20. A memory according to claim 18, wherein an impedance of the first and second differential inputs of said differential read circuit allows a maximum current that can flow through a respective first and second input to be greater than about 1 multiplied by a conduction current of said at least one second supplementary memory cell in a programmed state and less than about n−1 times the same conduction current.

21. A memory according to claim 13, wherein said selection circuit comprises a first RS type flip-flop circuit, and a second RS type flip-flop circuit having outputs respectively connected to an input of said first addressing latch and said second addressing latch; and wherein said first and second RS flip-flop circuits are controlled so that only one of said at least one first and at least one second supplementary cells is selected at a time.

22. A memory according to claim 13, further comprising at least one access pin; and wherein said selection circuit comprises means to activate said second addressing latch when a high voltage is present on said at least one access pin for enabling resetting of the second state bit.

23. A method for providing a software data protection (SDP) function and a one time protection (OTP) function in a non-volatile electrically erasable and programmable memory, the memory comprising a memory array including a plurality of memory cells each for storing an information bit, the method comprising the steps of:

storing in at least one first supplementary cell a first state bit corresponding to a write accessible or non-write accessible state of the plurality of memory cells in the memory array; and storing in at least one second supplementary cell a second state bit corresponding to a blank or non-blank state of a plurality of memory cells to be programmed only once in the memory array.

24. A method according to claim 23, further comprising the steps of:

activating a first addressing latch for selecting the at least one first supplementary cell; and activating a second addressing latch for selecting the at least one second supplementary cell, only one of the at least one first and at least one second supplementary cells being selected at a time.

25. A method according to claim 23, wherein the plurality of memory cells to be programmed only once is included within the memory array.

26. A method according to claim 23, wherein the at least one first supplementary cell comprises a plurality of 2n supplementary cells for redundantly storing the first state bit, where n is a non-zero integer; and wherein the plurality of 2n supplementary cells comprise n primary memory cells and n secondary memory cells, the step of storing the first state bit further comprising the steps of:

storing a first logic value in the n primary memory cells; and storing a second logic value in the n secondary memory cells, the second logic value being a complementary logic value to the first logic value.

27. A method according to claim 23, wherein the at least one second supplementary cell comprises a plurality of 2p supplementary cells for redundantly storing the second state bit, where p is a non-zero integer; and wherein the plurality of 2p supplementary cells comprise p primary memory cells and p secondary memory cells, the step of storing the second state bit further comprising the steps of:

storing a first logic value in the p primary memory cells; and storing a second logic value in the p secondary memory cells, where the second logic value being a complementary logic value to the first logic value.

28. A method according to claim 26, wherein the step of storing a first logic value comprises the step of loading a value of the n primary memory cells at a first differential input of a differential read circuit; and the step of storing a second logic value comprises the step of loading a value of the n secondary memory cells at a second differential input of the differential read circuit, the loading steps being performed simultaneously.

29. A method according to claim 27, wherein the step of storing a first logic value comprises the step of loading a value of the p primary memory cells at a first differential input of a differential read circuit; and the step of storing a second logic value comprises the step of loading a value of the p secondary memory cells at a second differential input of the differential read circuit, the loading steps being performed simultaneously.

30. A memory according to claim 29, wherein an impedance of the first and second differential inputs of the differential read circuit allows a maximum current that can flow through respective first and second inputs to be greater than about 1 multiplied by a conduction current of the at least one first supplementary cell in a programmed state and less than about n−1 times the same conduction current.

31. A memory according to claim 29, wherein an impedance of the first and second differential inputs of the differential read circuit allows a maximum current that can flow through a respective first and second input to be greater than about 1 multiplied by a conduction current of the at least one second supplementary memory cell in a programmed state and less than about n−1 times the same conduction current.

32. A method according to claim 24, further comprising the steps of:

connecting an output of a first RS type flip-flop circuit to an input of the first addressing latch; and connecting an output of a second RS type flip-flop circuit to an input of the second addressing latch, the first and second RS flip-flop circuits are controlled so that only one of the at least one first and at least one second supplementary cells is selected at a time.

33. A method according to claim 24, further comprising the step of activating the second addressing latch when a high voltage is present on at least one access pin for enabling resetting of the second state bit.

\* \* \* \* \*

UNITED STATES PATENT AND TRADEMARK OFFICE
CERTIFICATE OF CORRECTION

PATENT NO. : 5,999,447
DATED : December 7, 1999
INVENTOR(S) : NAURA ET AL.

It is certified that error appears in the above-identified patent and that said Letters Patent is hereby corrected as shown below:

Column 15, line 9    Strike: "claim 29"
                              Insert: - -claim 18

Signed and Sealed this

Nineteenth Day of September, 2000

Attest:

Q. TODD DICKINSON

*Attesting Officer*            *Director of Patents and Trademarks*